(12) United States Patent
Masschelein et al.

(10) Patent No.: US 10,730,368 B1
(45) Date of Patent: Aug. 4, 2020

(54) SYSTEM WITH WINDOWS

(71) Applicant: Apple Inc., Cupertino, CA (US)

(72) Inventors: Peter F. Masschelein, San Jose, CA (US); Martin Melcher, Mountain View, CA (US); Derek C. Scott, Santa Clara, CA (US); David E. Kingman, Campbell, CA (US)

(73) Assignee: Apple Inc., Cupertino, CA (US)

( * ) Notice: Subject to any disclaimer, the term of this patent is extended or adjusted under 35 U.S.C. 154(b) by 79 days.

(21) Appl. No.: 16/021,524

(22) Filed: Jun. 28, 2018

Related U.S. Application Data

(60) Provisional application No. 62/546,371, filed on Aug. 16, 2017.

(51) Int. Cl.

| | |
|---|---|
| *B60J 1/20* | (2006.01) |
| *H01L 27/32* | (2006.01) |
| *G09G 3/3208* | (2016.01) |
| *F21V 8/00* | (2006.01) |
| *E06B 9/24* | (2006.01) |
| *G02F 1/135* | (2006.01) |
| *G02F 1/1333* | (2006.01) |

(52) U.S. Cl.
CPC ............... *B60J 1/2094* (2013.01); *E06B 9/24* (2013.01); *G02B 6/0013* (2013.01); *G02F 1/135* (2013.01); *G02F 1/133308* (2013.01); *G09G 3/3208* (2013.01); *H01L 27/3241* (2013.01); *G02F 2001/1351* (2013.01); *G02F 2001/133331* (2013.01)

(58) Field of Classification Search
CPC ........ B60J 1/2094; E06B 9/24; G02B 6/0013; G02F 1/133308; G02F 1/135; G02F 2001/13331; G02F 2001/1351; G09G 3/3208; H01L 27/3241
See application file for complete search history.

(56) References Cited

U.S. PATENT DOCUMENTS

| | | | |
|---|---|---|---|
| 5,239,406 A | 8/1993 | Lynam | |
| 5,956,175 A * | 9/1999 | Hojnowski | ....... B32B 17/10018 359/360 |
| 6,391,400 B1 | 5/2002 | Russell et al. | |
| 6,797,396 B1 | 9/2004 | Liu et al. | |
| 6,927,900 B2 | 8/2005 | Liu et al. | |
| 6,929,864 B2 | 8/2005 | Fleming et al. | |
| 2009/0311497 A1 | 12/2009 | Aoki | |

(Continued)

*Primary Examiner* — Lori L Lyjak

(74) *Attorney, Agent, or Firm* — Treyz Law Group, P.C.; G. Victor Treyz; Kendall W. Abbasi

(57) ABSTRACT

A system such as a vehicle may have windows. A window may have a structural window layer such as a structural window layer formed from laminated glass layers. A thin chemically strengthened glass layer may be coupled to an inwardly facing surface of the structural window layer. A guest-host liquid crystal light modulator layer or other electrically adjustable optical component layer may be interposed between the chemically strengthened glass layer and the structural window layer. An infrared light-blocking coating may be formed on an inwardly facing surface of one of the pair of laminated glass layers. The inwardly facing surface of the thin chemically strengthened glass layer may be provided with a coating that includes a low emissivity layer to block heat and that serves as an antireflection coating.

20 Claims, 4 Drawing Sheets

(56) References Cited

U.S. PATENT DOCUMENTS

| | | | |
|---|---|---|---|
| 2016/0231480 A1* | 8/2016 | Boman | B05D 1/36 |
| 2017/0072662 A1* | 3/2017 | Fontela | B32B 7/12 |
| 2017/0100991 A1* | 4/2017 | Cammenga | B60J 3/04 |
| 2017/0146882 A1* | 5/2017 | Bass | G02F 1/155 |
| 2017/0197384 A1* | 7/2017 | Finkeldey | B32B 17/10045 |
| 2017/0240462 A1* | 8/2017 | Wagner | C03C 17/3626 |

* cited by examiner

SYSTEM WITH WINDOWS

This patent application claims the benefit of provisional patent application No. 62/546,371 filed on Aug. 16, 2017, which is hereby incorporated by reference herein in its entirety.

FIELD

This relates generally to structures that pass light, and, more particularly, to windows.

BACKGROUND

Windows such as vehicle windows sometimes include laminated glass layers. Laminated glass may be used, for example, to provide strength to front windshields. It can be challenging, however, to incorporate desired features into vehicle windows without creating structures that are vulnerable to damage or that do not offer desired levels of performance.

SUMMARY

A system such as a vehicle may have windows. A window may have a pair of glass layers that are laminated to form a structural window layer. A thin chemically strengthened glass layer may be coupled to an inwardly facing surface of the structural window layer.

A guest-host liquid crystal light modulator layer or other electrically adjustable optical component layer may be interposed between the chemically strengthened glass layer and the structural window layer. The adjustable optical component layer may include a light-emitting component or other structures that are electrically controlled by control circuitry in the system. The thin chemically strengthened glass layer may cover and help protect the adjustable optical component layer.

An infrared light-blocking coating may be formed on an inwardly facing surface of one of the pair of laminated glass layers. The inwardly facing surface of the chemically strengthened glass layer may be provided with an antireflection coating that includes a low emissivity layer to block heat.

DETAILED DESCRIPTION

A system may have windows formed from electrically adjustable components. The system may be a building, a vehicle, or other suitable system. Illustrative configurations in which the system with the windows is a vehicle may sometimes be described herein as an example. This is merely illustrative. Window structures may be formed in any suitable system.

The electrically adjustable components of the windows may be used to adjust the optical properties of the windows. For example, electrically adjustable windows may be adjusted to change the absorption of light and therefore the light transmission of the windows. An adjustable light modulator layer may, for example, serve as an electrically adjustable sunroof for a rooftop window or may be used to implement an electrically adjustable shade for a side, front, or rear window. In an illustrative configuration, the transparency of the window may be modulated using a liquid crystal light modulator such as a guest-host liquid crystal light modulator.

Adjustable optical component layers may also be used to display images, to provide illumination, and/or to otherwise adjust the appearance and behavior of a window. In arrangements such as these, an adjustable component such as an organic light-emitting diode display, an edge-lit light-guide plate that provides illumination, and/or an adjustable component that produces adjustable tint, adjustable reflectivity, adjustable light emission, adjustable haze, and/or other adjustable properties may incorporated into a window. Adjustable optical components for windows may sometimes be referred to as adjustable optical layers, adjustable window layers, technology layers, adjustable components, adjustable optical component layers, etc.

Adjustable optical layers and non-adjustable optical layers for windows may sometimes be formed from polymers and other materials that are prone to damage. For example, these materials may be scratched if exposed to the environment or may experience chemical damage if exposed to chemicals. This can make it difficult or impossible to incorporate adjustable optical layers effectively into a window for a system such as a vehicle.

To protect an adjustable optical layers in a window, a thin glass layer may be used to cover a potentially fragile window layer such as an adjustable optical layer or other layer that includes polymer or other materials that can be physically and/or chemically damaged. The thin glass layer may be chemically strengthened and may be covered with one or more layers such as low emissivity ("low-e") coating layers and antireflection coating layers to enhance vehicle occupant comfort.

Figure 1:
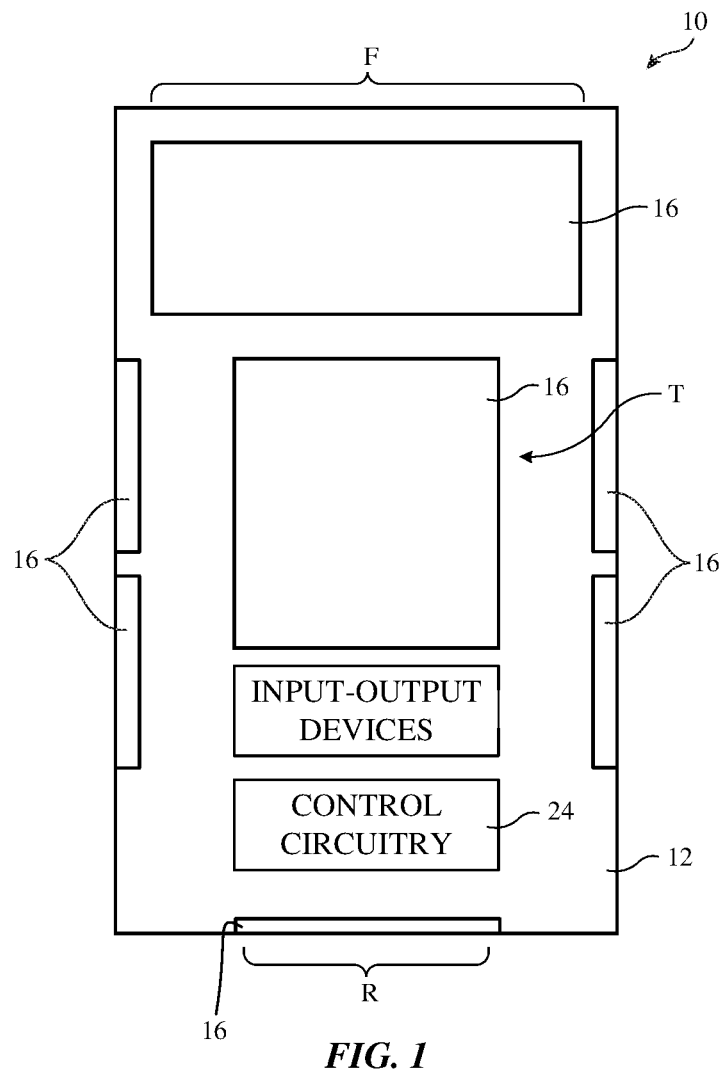
FIG. 1 is a schematic diagram of an illustrative system in accordance with an embodiment.

An illustrative system of the type that may include windows with protective thin glass layers is shown in FIG. 1. As shown in FIG. 1, system 10 may be a vehicle having a body such as body 12 with a chassis to which wheels are mounted, propulsion and steering systems, and other vehicle systems. Body 12 may include doors, trunk structures, a hood, side body panels, a roof, and/or other body structures. Seats may be formed in the interior of body 12. Vehicle 10 may include windows such as window(s) 16. Window 16 and portions of body 12 may separate the interior of vehicle 10 from the exterior environment that is surrounding vehicle 10.

Windows 16 may include a front window 16 on front F of vehicle 10, a moon roof (sun roof) window 16 or other window extending over some or all of top T of vehicle 10, a rear window 16 on rear R of vehicle 10, and side windows on the sides of vehicle 10 between front F and rear R.

Figure 2:
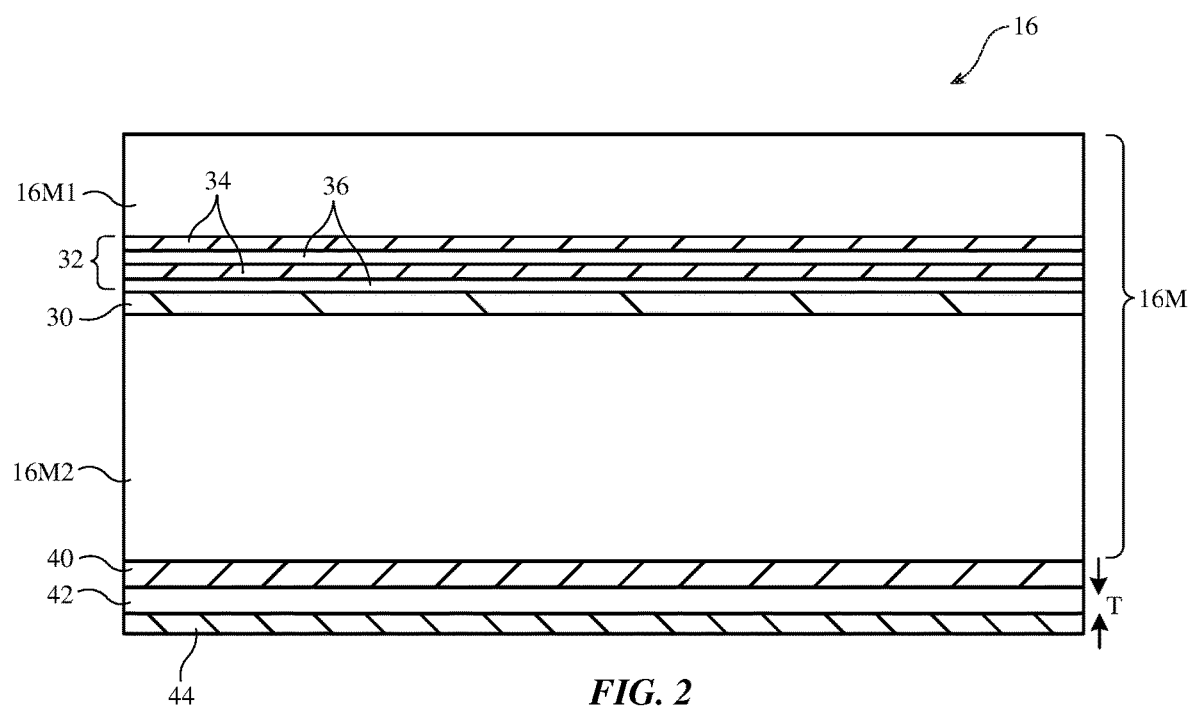
FIG. 2 is a cross-sectional side view of an illustrative window for the system of FIG. 1 in accordance with an embodiment.

An illustrative configuration for a window such as one of windows 16 of FIG. 1 is shown in FIG. 2. As shown in FIG. 2, window 16 may include a main structural portion such as structural window layer 16M. Layer 16M may be formed from one or more layers of transparent glass, clear polymer (e.g., polycarbonate), polymer adhesive layers, and/or other layers. These layers may be strengthened (e.g., by annealing, tempering, and/or chemical strengthening). In some arrangements, layer 16M may include only a single structural layer (e.g., a layer of glass having a thickness of 3-6 mm or other suitable thickness for providing window 16 with sufficient structural support to allow window 16 to be used in a vehicle). In other arrangements, two or more layers of structural glass may be used in forming layer 16M.

In the illustrative configuration of FIG. 2, layer 16M is formed from outer structural window layer 16M1 and inner structural window layer 16M2. Outer layer 16M1 may, as an example, be a layer of soda lime glass having a thickness of 1.6 to 3.2 mm thick, at least 1.5 mm thick, less than 4 mm thick, or other suitable thickness and inner layer 16M2 may, as an example, be a layer of soda lime glass having a thickness of 1.6 to 3.2 mm thick, at least 1.5 mm thick, less than 4 mm thick, or other suitable thickness. Layers 16M1 and 16M2 may be laminated to each other using polymer layer 30 (e.g., to form a laminated structural window layer 16M). Polymer layer 30 may be, for example, a polymer such as polyvinyl butyral (PVB) or ethylene-vinyl acetate (EVA). Polymer layer 30 may have a thickness of 0.76 mm or other suitable thickness (e.g., greater than or less than 0.76 mm). If desired, a thinner polymer layer (e.g., a layer of 0.38 mm) may be used in a configuration of the type including an outer glass layer, polymer layer 30, and a stiff interlayer (e.g., a polyethylene terephthalate layer). In a configuration with outer glass 16M1, coating 32, polymer layer 30, and inner glass 16M1, polymer layer 30 may have a thickness of about 0.76 mm. In general, any suitable thickness may be used for layer 30 (e.g., at least 0.3 mm, less than 0.8 mm, etc.)

As shown in FIG. 2, optional coating layer 32 may be formed on the inner (inwardly facing) surface of outer layer 16M1. Coating layer 32 may include one or more sublayers and may be used to provide infrared-light blocking and other desired properties to window 16. As an example, layer 32 may be an infrared-light blocking layer having one or more silver layers 34 and one or more metal oxide layers or other dielectric layers 36 in a configuration that reduces infrared light transmission (e.g., transmission of solar infrared light at wavelengths of about 0.7 microns to 2.5 microns) to less than 50%, less than 10%, etc. while transmitting visible light (e.g., transmitting at least 70% of visible light or at least transmitting more visible light than infrared light, etc.). Infrared-light blocking layers (e.g., coating layer 32) may include one silver layer, two silver layers, three silver layers (triple silver), four layers of silver (quad silver), or other suitable infrared-light-blocking coating materials. By blocking infrared light, vehicle occupant comfort may be enhanced. If desired, other types of optical filter layer may be formed from coating layer 32 (e.g., tinting, neutral density filtering, etc.). Coatings such as coating layer 32 may also be formed on other surfaces of the glass layers in layer 16M. The example of FIG. 2 is merely illustrative.

Adjustable optical layer 40 (and/or one or more fixed optical layers) may be formed on the inner surface of layer 16M (e.g., by laminating one or more structures to the inner surface of inner layer 16M2). To protect layer 40, a protective layer such as thin glass layer 42 may be cover the inner surface of layer 40. Layer 42 may be formed from soda lime glass, aluminosilicate glass, or other suitable glass. Layer 42 may, for example, be laminated to the inner surface of layer 42 using adhesive.

Layer 42 may have a thickness T that is relatively small (e.g., 0.1-1 mm, less than 1 mm, less than 0.6 mm, less than 0.3 mm, at least 0.1 mm, etc.) and may be chemically strengthened to help resist breakage during manufacturing (e.g., to ensure that layer 42 is not broken during handling, lamination, and other manufacturing operations) and to resist damage during use in system 10 (e.g., to resist damage from impacts, scratching, etc.). Layer 42 may be chemically strengthened before attaching layer 42 to the inner surface of window layer 16M2. For example, layer 42 may be chemically strengthened by placing layer 42 in a heated potassium salt bath to perform an ion-exchange process. Chemical strengthening may enhance the compressive stress of the outermost portions of layer 42 (e.g., portions penetrating to a depth of about 100 microns, at least 50 microns, less than 150 microns, or other suitable depth from the surfaces of layer 42) relative to deeper portions in layer 42. The stress profile produced during chemical strengthening may be selected to ensure safe window fracture behavior in the event of collision-induced damage or other damage to system 10. To ensure that layer 42 conforms to the inner surface of layer 16M, which may be curved, layer 42 may, if desired by pre-shaped into a shape that matches the shape of the inner surface of layer 16M. Configurations in which layer 42 is shaped by cold bending may also be used.

Coating layers such as illustrative coating 44 may be formed on layer 42. With one illustrative configuration, coating 44 may be a low-emissivity coating that helps block heat from the interior of body 12. Low-emissivity coating 44 may be deposited onto layer 42 after layer 42 is chemically strengthened. During exposure of window 16 to light (e.g., solar radiation), visible light and near infrared light may be absorbed by the layers of window 16 (e.g., layer 40, etc.) and may re-radiate this absorbed energy as heat (e.g., infrared light at wavelengths of 3-10 microns, at least 4 microns, etc.). Low-emissivity coating 44 may block this heat and thereby enhance thermal comfort in the interior portions of system 10. To help reduce light reflections that might distract a vehicle occupant or other user of system 10 when looking through window 16, coating 44 may, if desired, be configured to form an antireflection layer (e.g., the thin-film layers of coating 44 including any low-e layer(s) may be configured to form a thin-film interference filter with visible light antireflection properties).

Figure 3:
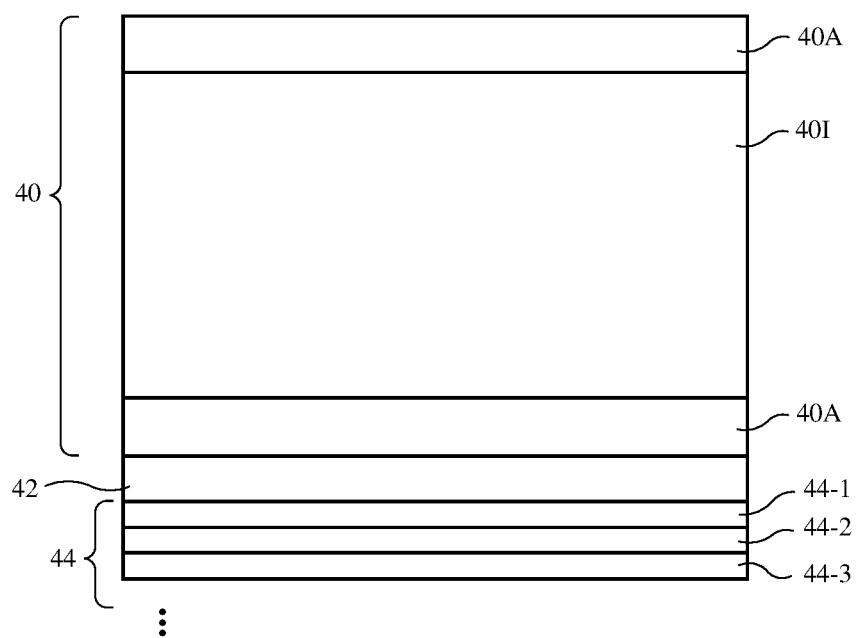
FIG. 3 is a cross-sectional side view of an illustrative adjustable optical component layer and associated window structures for the illustrative window of FIG. 2 in accordance with an embodiment.

FIG. 3 is a cross-sectional side view of illustrative window structures that may be formed on the inner surface of layer 16M. As shown in FIG. 3, adjustable optical layer 40 may include adhesive layers 40A and a layer such as adjustable optical layer 40I. Layers 40A may be transparent adhesive layers that are used to respectively attach layer 40I to the inner surface (inwardly facing surface) of layer 16M2 (FIG. 2) and the outer surface (outwardly facing surface) of layer 40. Layer 40I may be a light modulator layer, a light-emitting layer, a transparent display layer, or other adjustable optical component layer. Layer 40I may include one or more polymer layers (e.g., a transparent polymer substrate or substrates for a light modulator, a transparent polymer display substrate, a transparent light guide plate, etc.). These layers are potentially vulnerable to damage from scratches, exposure to humidity and chemicals, and exposure to finger oils and other contaminants, and may therefore be protected due to the presence of thin glass layer 42.

Coating layer 44 on the inwardly facing surface of glass layer 42 may include multiple layers 44 of material such as illustrative layers 44-1, 44-2, and 44-3. The materials and thickness of layers 44 may be configured to form a low emissivity coating and/or an antireflection coating (e.g., a thin-film interference filter that serves as a visible-light antireflection layer). With one illustrative arrangement, layer 44-1 may be an inorganic layer such as a layer of silicon nitride that serves as an adhesion layer that promotes adhesion between layer 44-2 and layer 42 and that serves as a barrier layer (e.g., a barrier layer preventing ion migration from layer 42 into layers 44-2, 44-3, etc.). Layer 44-2 may be a tin oxide layer with fluorine dopant to render the tin oxide layer conductive and/or other dopant, a layer of indium tin oxide, or other layer(s) (with or without dopant) that exhibits a low emissivity (e.g., a low-e layer having an emissivity of less than 30%, less than 20%, or other value that is relatively low compared to the emissivity of layer 42, which may be, for example, about 87%). Layer 44-3 may be an inorganic dielectric layer such as a silicon nitride protective layer that helps protect layer 44-2 from damage. One or more additional layers may, if desired, be formed on layer 44-3 to provide layer 44 with desired low emissivity and/or antireflection properties.

Figure 4:
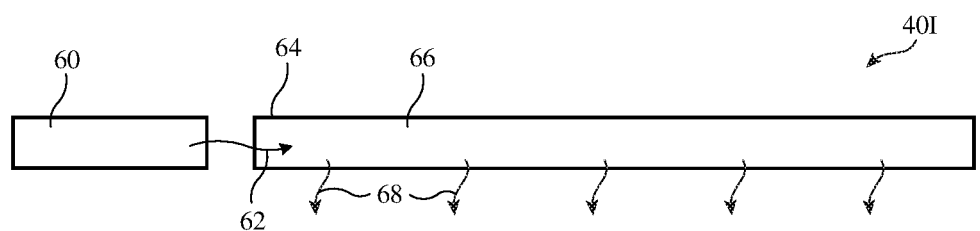
FIGS. 4, 5, and 6 are cross-sectional side view of illustrative adjustable optical component layers in accordance with embodiments.
Figure 5:
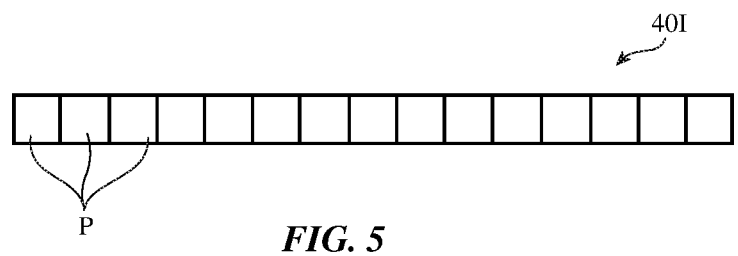
Figure 6:
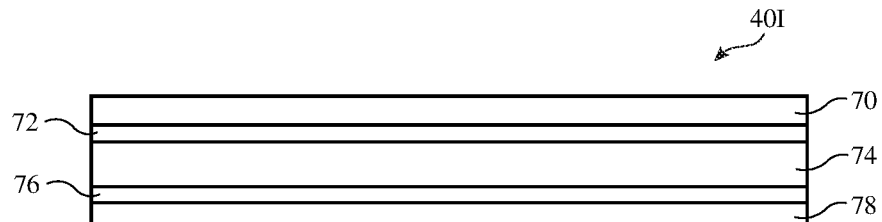

FIGS. 4, 5, and 6 are cross-sectional side views of illustrative adjustable optical layers 401 that may be used in window 16.

In the example of FIG. 4, layer 401 has a light source such as light source 60 (e.g., one or more light-emitting diodes) configured to emit light 62 into edge 64 of light guide layer 66. Layer 66 may be formed from a transparent layer of plastic or glass and may contain light-scattering particles and/or light-scattering structures such as protrusions and/or recesses to scatter light 62 outwardly as light 68. Light 68 may, as an example, serve as interior and/or exterior illumination in system 10, as display backlighting (e.g., backlight illumination for an array of display pixels), and/or as other light in system 10. The amount of light produced by light source 60 may be adjusted dynamically by control circuitry 24 (FIG. 1).

FIG. 5 shows how layer 401 may have an array of pixels P. Pixels P may be organic light-emitting diode pixels each of which contains a respective organic light-emitting diode, liquid crystal display pixels, and/or other adjustable pixels. The pixels of the array of pixels of layer 401 allow layer 401 of FIG. 5 to serve as a display. During operation of system 10, control circuitry 24 (FIG. 1) may adjust pixels P to display images for a user. Layer 401 may, as an example, be a transparent display that allows a user to view images while simultaneously viewing real world objects through the display.

Another illustrative configuration for adjustable optical layer 401 is shown in FIG. 6. In the example of FIG. 6, layer 401 is a guest-host liquid crystal light modulator. As shown in FIG. 6, layer 401 may have upper and lower transparent substrates such as upper substrate 70 and lower substrate 78. Transparent conductive electrodes may be formed on the inwardly facing surfaces of substrates 70 and 78, as illustrated by upper transparent conductive electrode 72 and lower transparent conductive electrodes 76, respectively. Transparent conductive electrodes 72 and 76 may be formed from indium tin oxide or other transparent conductive material. A layer of liquid crystal material such as layer 74 may be interposed between electrodes 72 and 76. Layer 74 may include guest dye molecules and host liquid crystal molecules. The dye molecules may have anisotropic light absorption properties. The orientation of the guest dye molecules may be controlled by electrically controlling the orientation of the host liquid crystal molecules (e.g., by using control circuitry 24 to adjust the voltage across electrodes 72 and 76). As a result, the light absorption through layer 401 (e.g., visible light absorption) can be electrically adjusted.

When layer 401 of FIG. 6 is incorporated into window 16, the amount of light that passes through window 16 may be adjusted (e.g., to reduce bright light and thereby dim the interior of body 12, to block the interior of body 12 from view from the exterior of body 12 to enhance privacy, etc.). Window 16 may be a roof-top window, a side window, or a rear window. Configurations in which light modulator layers such as adjustable light modulator layer 401 of FIG. 6 are incorporated into a portion of a front window (e.g., to adjust light transmission through a band along an upper edge of the window that serves as an electronic sun visor) may also be used. Moreover, other types of adjustable optical layer may be incorporated into some or all of windows 16, such as adjustable haze layers, adjustable color layers, layers with adjustable reflectivity, etc. The examples of FIGS. 4, 5, and 6 are illustrative.

The foregoing is merely illustrative and various modifications can be made to the described embodiments. The foregoing embodiments may be implemented individually or in any combination.

What is claimed is:

1. A window, comprising:
    a structural window layer;
    a chemically strengthened glass layer having first and second surfaces;
    an adjustable optical component layer interposed between the structural window layer and the chemically strengthened glass layer, wherein the first surface of the chemically strengthened glass layer faces the adjustable optical component layer; and
    a coating on the second surface of the chemically strengthened glass layer.

2. The window defined in claim 1 wherein:
    the structural window layer includes first and second glass layers coupled by an interposed polymer layer; and
    the coating comprises a low-emissivity layer configured to block heat.

3. The window defined in claim 2 wherein the coating forms an antireflection layer.

4. The window defined in claim 2 wherein the low-emissivity layer comprises a layer selected from the group consisting of: a tin oxide layer and an indium tin oxide layer.

5. The window defined in claim 4 wherein the coating includes at least a first inorganic dielectric layer and a second inorganic dielectric layer and wherein the low-emissivity layer is interposed between the first and second inorganic dielectric layers.

6. The window defined in claim 2 wherein the adjustable optical component layer comprises a guest-host liquid crystal light modulator layer.

7. The window defined in claim 2 further comprising an infrared-light-blocking layer on a surface of the first glass layer facing the second glass layer.

8. The window defined in claim 7 wherein the first and second glass layers comprise tempered soda lime glass layers.

9. The window defined in claim 8 wherein the chemically strengthened glass layer comprises soda lime glass.

10. The window defined in claim 8 wherein the chemically strengthened glass layer comprises aluminosilicate glass.

11. The window defined in claim 1 wherein the chemically strengthened glass layer has a thickness of less than 1 mm.

12. The window defined in claim 1 wherein the adjustable optical component layer comprises a light guide plate having an edge configured to receive light from a light-emitting diode.

13. The window defined in claim 1 wherein the adjustable optical component layer comprises an array of organic light-emitting diode pixels.

14. A window, comprising:
a structural window layer;
a chemically strengthened glass layer; and
an optically adjustable layer configured to emit light that is interposed between the structural window layer and the chemically strengthened glass layer.

15. The window defined in claim 14 wherein the chemically strengthened glass layer has a thickness of less than 1 mm, the window further comprising a low-emissivity layer on the chemically strengthened glass layer.

16. The window defined in claim 15 wherein the structural window layer has first and second glass layers each with a thickness of at least 1.5 mm and has a polymer layer interposed between the first and second glass layers.

17. The window defined in claim 16 wherein the optically adjustable layer includes a guest-host liquid crystal layer.

18. A vehicle, comprising:
a body having an interior;
control circuitry;
an adjustable window in the body that is between the interior and an exterior region surrounding the body, wherein the adjustable window comprises:
a structural window layer including first and second glass layers;
a chemically strengthened glass layer having a thickness of less than 1 mm;
an optical component layer between the chemically strengthened glass layer and the structural window layer;
a coating on the chemically strengthened glass layer, wherein the chemically strengthened glass layer is interposed between the coating and the optical component layer.

19. The vehicle defined in claim 18 wherein the optical component layer comprises a guest-host liquid crystal light modulator and wherein the coating comprises a low-emissivity layer.

20. The vehicle defined in claim 19 wherein the coating includes inorganic dielectric layers and wherein the low-emissivity layer has an emissivity of less than 30% and is interposed between the inorganic dielectric layers.

* * * * *